(12) United States Patent
Katagiri et al.

(10) Patent No.: US 7,745,237 B2
(45) Date of Patent: Jun. 29, 2010

(54) PATTERN FORMING METHOD AND PATTERN FORMING SYSTEM

(75) Inventors: Souichi Katagiri, Kodaira (JP); Yasunari Sohda, Kawasaki (JP); Masahiko Ogino, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 229 days.

(21) Appl. No.: 11/626,402

(22) Filed: Jan. 24, 2007

(65) Prior Publication Data
US 2007/0172967 A1    Jul. 26, 2007

(30) Foreign Application Priority Data
Jan. 24, 2006   (JP) ............... 2006-014525

(51) Int. Cl.
*H01L 21/66* (2006.01)
*H01L 21/461* (2006.01)
*G01R 31/26* (2006.01)

(52) U.S. Cl. ............ 438/14; 438/17; 438/748; 264/40.5; 264/220; 264/408; 257/E21.504; 257/E21.595; 257/E23.179

(58) Field of Classification Search .......... 257/E21.504, 257/E21.595, E23.179
See application file for complete search history.

(56) References Cited

U.S. PATENT DOCUMENTS

| | | | |
|---|---|---|---|
| 5,259,926 A | 11/1993 | Kuwabara et al. | |
| 5,408,320 A | 4/1995 | Katagiri et al. | |
| 5,772,905 A | 6/1998 | Chou | |
| 6,790,870 B1 * | 9/2004 | Desimone et al. | |
| 2004/0141163 A1 | 7/2004 | Bailey et al. | |
| 2004/0142575 A1 | 7/2004 | Brewer | |
| 2005/0023145 A1 * | 2/2005 | Cohen et al. ............. | 205/118 |
| 2006/0127522 A1 * | 6/2006 | Chou ..................... | 425/150 |

FOREIGN PATENT DOCUMENTS

EP    0 794 016    9/1997

OTHER PUBLICATIONS 48.4: One Micron Precision Optically Aligned Method for Hot-Embossing and Nanoimprinting, Islam, R. et al, Proceedings of the IEEE Sensors 2002, Orlando, FL. Jun. 12-14, 2002, IEEE International Conference on Sensors, New York, NY vol. 1 of 2 Conf. 1 Jun. 12, 2002 pp. 931-935.

* cited by examiner

*Primary Examiner*—Charles D Garber
*Assistant Examiner*—Mohsen Ahmadi
(74) *Attorney, Agent, or Firm*—Antonelli, Terry, Stout & Kraus, LLP.

(57) ABSTRACT

Method of forming a pattern by a nanoimprint technique starts with preparing a mold with nanostructures on its surface. The mold is pressed against a substrate or plate coated with a resin film. The positions of alignment marks formed on the rear surface of the plate coated with the resin film are detected. Thus, a relative alignment between the mold and the plate coated with the resin film is performed.

17 Claims, 8 Drawing Sheets

PATTERN FORMING METHOD AND PATTERN FORMING SYSTEM

BACKGROUND OF THE INVENTION

The present invention relates to method and system for forming patterns using a nanoimprint technique. More particularly, the invention relates to a mark position detection system adapted for improvement of alignment accuracy in forming patterns using a nanoimprint technique and to a fine pattern forming system employing this method.

In recent years, finer patterning and higher levels of integration of semiconductor integrated circuits have been in progress. As a pattern printing technology for achieving the fine processing technology, the accuracies of photolithography systems are increasingly progressed. However, the minimum feature size has approached the wavelength of the light source for optical exposure. Also, the lithography technology has approached its limit. Therefore, to achieve still finer patterning and higher accuracy, electron beam writing systems that are one kind of charged particle beam systems have began to be used instead of the lithography technology.

Formation of a pattern using an electron beam adopts a method of consisting of drawing a mask pattern unlike the pattern imaging used in pattern formation employing a light source such as i-line or excimer laser. Therefore, as the number of drawn patterns is increased, the exposure time (drawing time) is increased and hence it takes a long time to form patterns. This is regarded as a drawback. Consequently, as the memory capacity is increased from 256 Mega to 1 Giga and to 4 Giga (i.e., as the scale of integration is increased drastically), the time taken to form patterns is accordingly prolonged drastically. There is the anxiety that the throughput will be deteriorated severely. Accordingly, a cell projection method is being developed to increase the speed of operation of electron beam writing systems. In this method, masks of various shapes are combined and irradiated with an electron beam in a batch mode to form a complexly shaped electron beam. As a result, patterns are made finer but it has become indispensable to increase the size and complexity of the electron beam writing system. There is the disadvantage that the system cost is increased.

In contrast, techniques for forming fine patterns at low cost are disclosed, for example, in the above-cited U.S. Pat. Nos. 5,259,926 and 5,772,905. In particular, a desired pattern is transferred by pressing a mold having the same pattern of nanostructures on its surface as a pattern to be formed on a substrate into a resist film layer formed on the surface of a substrate to which the pattern should be transferred. Especially, according to the nanoimprint technology described in U.S. Pat. No. 5,772,905, a silicon wafer is used as a mold, and fine structures of less than 25 nanometers can be formed by transfer.

Where a fine pattern of a semiconductor integrated circuit or the like is formed, it is necessary to make an accurate alignment, for example, with a reticle or the like on which an original pattern is formed after precisely detecting the pattern position on the substrate placed on a stage. The alignment accuracy needs to be enhanced further as finer patterns are used when the scales of integration of semiconductor devices are increased. For example, in order to form a pattern at the 32-nm node, an accurate alignment is required to be performed with an error less than 10 nm.

When a pattern is formed using a nanoimprint technique, resin is applied to the surface of a substrate to which the pattern will be transferred, and then a mold on which an original pattern has been formed is brought and pressed into contact with the substrate. The mold and substrate are required to be heated or irradiated with UV light. In the prior-art lithography equipment, the reticle on which the original pattern is formed and a plate or substrate on which a pattern will be formed are held in a non-contacting relationship. Under this condition, the pattern is optically transferred. Alternatively, the pattern is transferred by drawing it. Therefore, there is not any factor that produces positioning error where a contact is made when an alignment is made. Meanwhile, in nanoimprinting, contact is unavoidable in principle and so an inexperienced problem will occur. As the resin film suffers from nonuniform deformation in the pressing step, problems take place. For example, light rays used in detecting positions are refracted nonuniformly, resulting in position detection errors. An external force is exerted in a direction different from the pushing direction, producing positional deviation.

Where parallelism is not secured with the substrate to which a transfer is made during the contact and pressing steps, a variation of the thickness of the resin occurs after the transfer. As a result, etching defects are produced in the pattern.

SUMMARY OF THE INVENTION

It is an object of the present invention to provide a pattern forming system which can precisely perform alignment with a positioning error of less than 10 nm when a pattern is formed in a semiconductor device fabrication step using nanoimprinting and which can form the pattern with a uniform resin thickness.

One feature of the present invention is to provide a method of pattern formation using nanoimprinting for forming a pattern by pressing a mold with nanostructures on its surface against a substrate or plate coated with a resin film. The method of pattern formation involves a step of consisting of performing a relative alignment between the mold and the plate coated with the resin film by detecting the positions of alignment marks formed on the rear surface of the plate coated with the resin film.

A method according to an embodiment of the invention comprises the steps of: measuring the distance between a mold and a plate or substrate coated with a resin film; stopping the mold immediately before it comes into contact with the plate coated with the resin film; performing a relative alignment of a relative position between the mold and the plate coated with the resin film within a plane in which a pattern will be formed; and pressing the mold against the plate coated with the resin film while holding the relative position.

In the step of measuring the distance between the mold and the plate coated with the resin film, alignment marks which create a line-and-space pattern formed on the mold are preferably illuminated with a given periodic pitch with a beam emitted from a light source consisting of a laser, and the distance of the mold to the plate coated with the resin is measured using the zeroth-order diffraction light out of diffraction light reflected from the alignment marks.

A further feature of the invention is to provide a pattern forming system for forming a pattern by pressing a mold with nanostructures on its surface against a substrate or plate coated with a resin film, using nanoimprinting. The system has (i) means for pressing the mold against the plate coated with the resin film and (ii) means for performing a relative alignment between the mold and the plate coated with the resin film within a plane in which the pattern will be formed, by detecting positions of alignment marks on the rear surface of the plate coated with the resin.

Use of the present invention enables accurate alignment. Also, method and system for forming fine patterns using nanoimprinting capable of forming patterns with uniform film thickness can be obtained.

Other objects, features and advantages of the invention will become apparent from the following description of the embodiments of the invention taken in conjunction with the accompanying drawings.

DETAILED DESCRIPTION OF THE INVENTION

Figure 2:
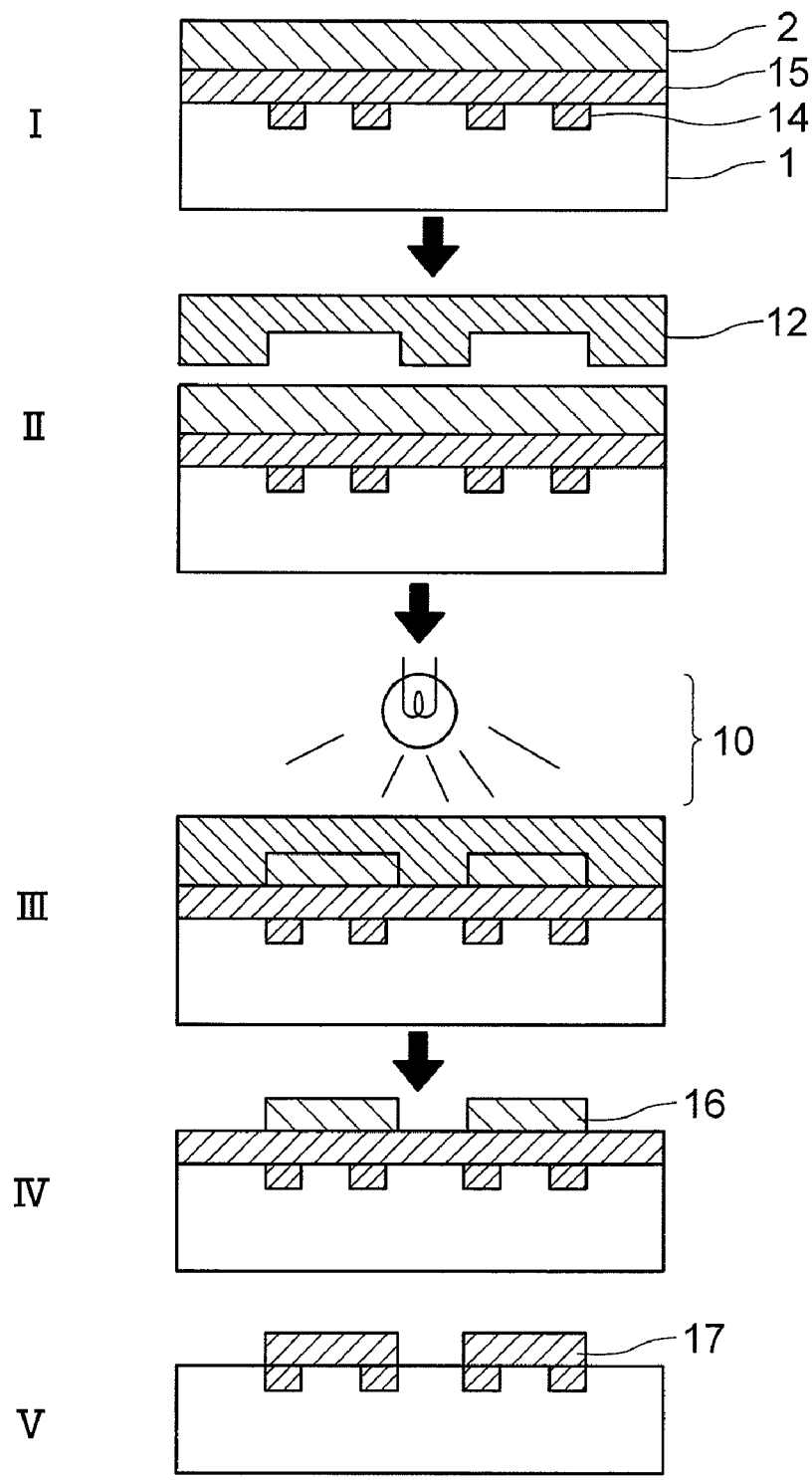
FIG. 2 is a diagram illustrating a method of forming a pattern using nanoimprinting.

A procedure for forming a pattern using nanoimprinting is first described by referring to FIG. 2. This figure schematically illustrates a method of forming an interconnection pattern in a case where a photo-hardening resin (photocurable resin) is used. The interconnection pattern 14 is formed on a wafer 1. An upper layer of interconnection film 15 is formed on the surface. Furthermore, the photo-hardening resin (photocurable resin) 2 is applied (refer to I). Then, a mold 12 having a pattern (nanostructures) formed thereon is brought close to the wafer 1 from above it. Before they contact with each other, the mold 12 and the wafer 1 are aligned. Subsequently, both are pressed against each other, thus making a pattern (refer to II). The mold 12 is made of quartz and transmits light. After the mold 12 is pressed, the mold 12 is illuminated with UV light from behind the mold 12 to cure the photo-hardening resin film 2 (refer to III). The mold 12 is lifted up. The base layer remaining at the bottom of the concave pattern is removed. A resin pattern 16 is formed (refer to IV). Using the resin pattern 16 as a mask, the underlying interconnection pattern is etched. Consequently, an interconnection pattern 17 is formed (refer to V).

Figure 1:
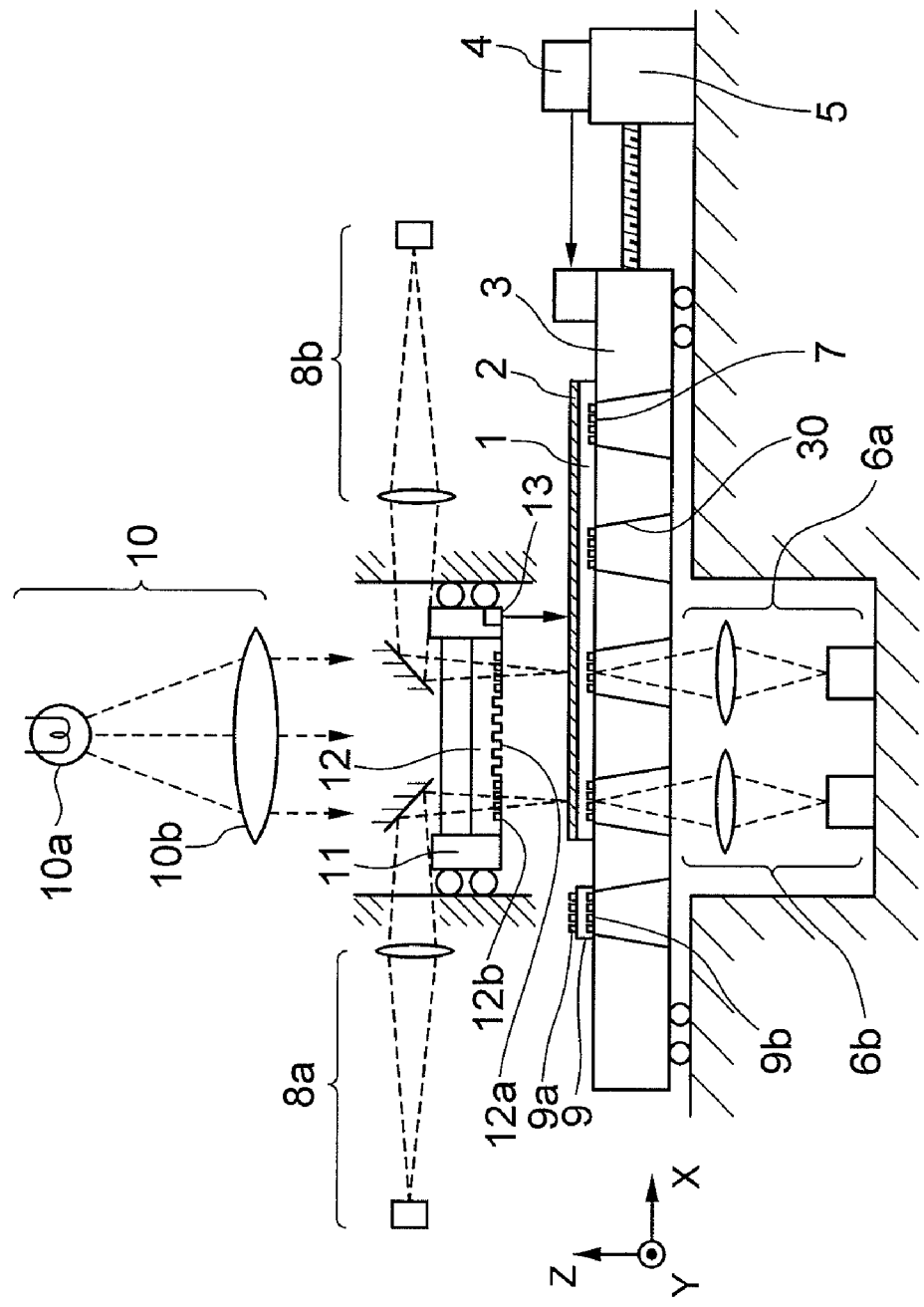
FIG. 1 is a diagram schematically illustrating the configuration of a pattern forming system according to an embodiment of the present invention.

An embodiment of the present invention that can carry out the procedure described so far is described by referring to FIG. 1. FIG. 1 shows the fundamental structure of a pattern forming system (i.e., lithography system) for fabricating semiconductor devices using nanoimprinting. A resin is applied on the surface of the wafer 1 to which a pattern will be transferred, and is held on a stage 3. The stage 3 has a mechanism capable of performing alignment in the direction of one axis (X) in the figure. In addition, the mechanism is capable of performing alignment in a direction (Y) perpendicular to the plane of the paper and alignment in raw rotation (YAW) within the XY plane. The position of the stage 3 is measured by a laser displacement measuring system 4 and moved into a given position by a means 5 of driving the stage.

A mold stage 11 on which the mold 12 is carried is installed above the stage 3. A pattern to be transferred to the wafer 1 is formed on the mold 12. The mold stage 11 is designed to be placed in position in the up-and-down direction (Z). The mold stage has Z sensors 13 capable of measuring the distance to the wafer plate and a load sensor (not shown) capable of measuring the load produced after contact with the wafer 1. A laser displacement measuring system, an electrostatic gap sensor, or the like can be used as each Z sensor 13. By mounting the Z sensors in plural positions on the mold stage, the mold can be pressed against the plate while securing the parallelism between the mold and the plate.

The mold 12 is made of a transparent plate or substrate (e.g., quartz or glass) and transmits light. The wafer 1 and mold 12 can be identical in size. Alternatively, the size of the mold 12 may be a fraction of the size of the wafer 1, in which case the pattern is transferred while moving the stage in steps as in the prior-art stepper system to form a pattern over the whole wafer.

A mercury lamp 10a is mounted in a still higher position. Illumination light follows an optical route indicated by the broken lines and is transmitted through illumination optics 10b, so that the light is converted into a parallel beam. The illumination light is then transmitted through the mold 12 and illuminates the photo-hardening resin film 2. The optical dose and exposure time for the illumination can be controlled by a shutter (not shown).

Rear surface position detectors 6a and 6b (hereinafter may be collectively indicated by numeral 6) for detecting the positions of rear surface alignment marks 7 formed on the rear surface of the wafer 1 are present under the stage 3. The detectors 6a and 6b are held to a system reference position and measure the absolute position of the system reference. Meanwhile, mold position detectors 8a and 8b (hereinafter may be collectively indicated by numeral 8) for detecting the position of the surface of the mold on which a pattern will be formed are present above the stage 3. The mold position detectors 8a and 8b can measure the positions of the mold alignment marks 12b previously formed on the surface of the mold 12, using the mold position detectors 8a and 8b, immediately before the descending mold comes into contact with the wafer 1 (e.g., in a region from the position at which the mold is poised, for example, 10 μm, above the wafer to the position at which the mold touches the wafer). Detectable positions can be in the in-plane direction of the mold. In addition, the position can be in the heightwise direction. The structure and functions of the present position detecting means 8a and 8b are described later. The mold position detectors 8a and 8b are held to the reference position of the system, and measure the absolute position of the system reference for the mold. The wafer 1 is not limited to a Si substrate. It may also be a GaAs substrate, glass substrate or plate, or plastic substrate.

Since the rear surface position detectors 6 and mold position detectors 8 are independent position detectors, it is necessary to calibrate the reference position. A chip 9 for calibration is a means used for the calibration. The structure and functions of the present chip are described in detail later.

Figure 3:
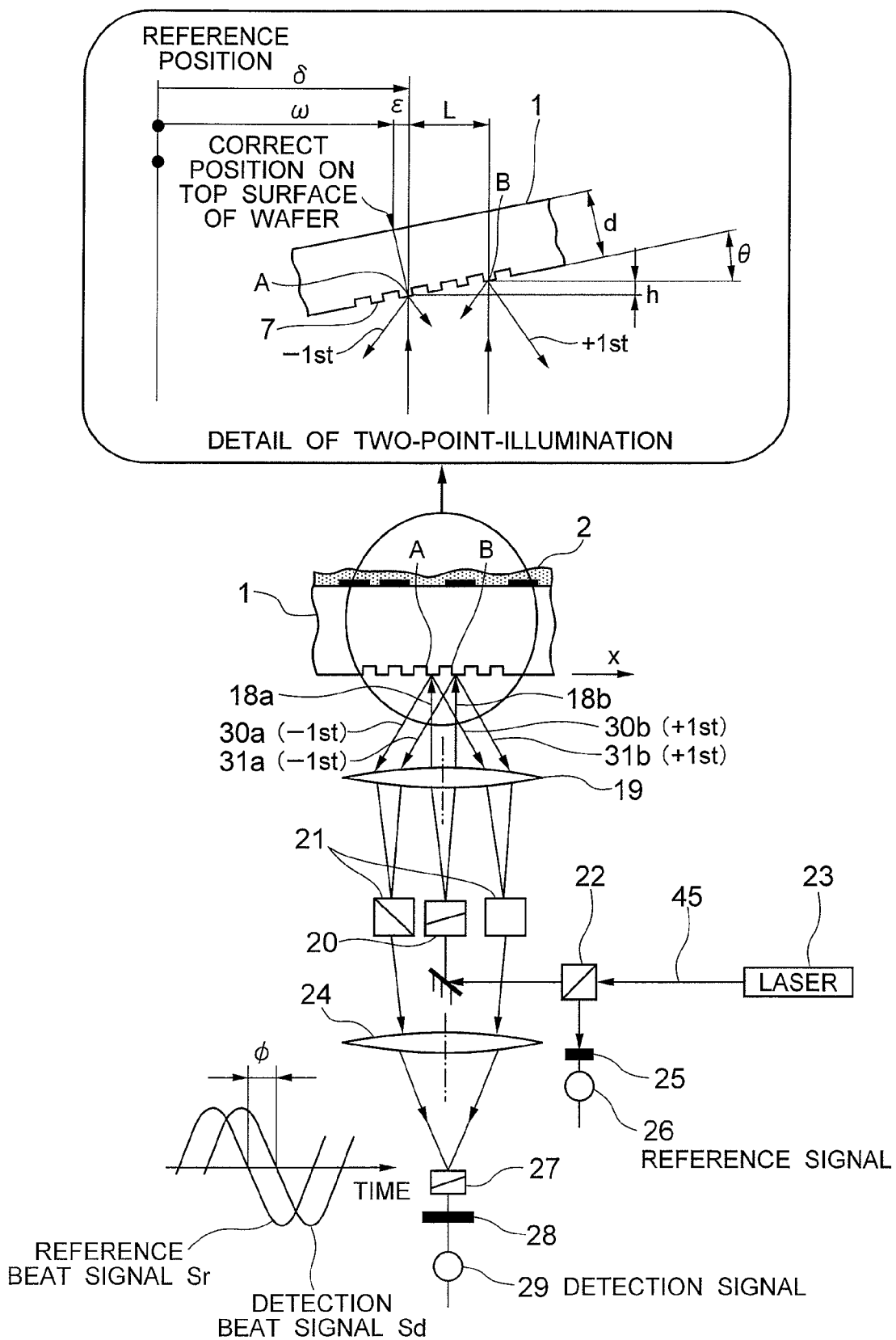
FIG. 3 is a diagram illustrating a method of aligning the rear surface of a wafer in accordance with another embodiment of the invention.

Main functions are next described in detail. First, the wafer rear surface position detectors 6a and 6b are described. As shown in FIG. 3, in a condition where the wafer 1 is tilted through an angle θ from the set reference plane, a deviation given by d sin θ (where d is the thickness of the wafer 1) is produced between the actual position (at a distance δ from the reference position) of each rear surface alignment mark 7 made on the rear surface of the wafer and the correct position on the wafer surface (at a distance ω from the reference position) corresponding to the rear surface alignment mark 7. Accordingly, where the actual position (distance δ) of the rear surface alignment mark 7 is detected and the detected value is directly taken as the correct position (distance ω) on the wafer surface, position detection error ε occurs as a matter of course. For example, if it is assumed that the thickness d of the wafer is 600 μm and the tilt angle θ of the wafer is 5 degrees, the amount of error ε is about 15 nm. This value can no longer be neglected in a case where stringent alignment accuracy such as 10 nm is required. Accordingly, using the rear surface position detectors 6a and 6b producing position detection values containing deviation ΔE that cancels out the amount of error ε, the apparent position (δ+ΔE) of each rear surface alignment mark 7 formed on the rear surface of the wafer is detected. The apparent position is made to represent the correct position (ω) on the wafer surface. That is, various parameters for the rear surface position detectors 6a and 6b are previously selected such that the result of detection (δ+ΔE) of the apparent mark position using the rear surface position detectors 6a and 6b becomes equal to the correct position (ω) on the wafer surface corresponding to the rear surface alignment mark 7, i.e., such that the following relationship holds:

$$\omega = \delta + \Delta E \quad (1)$$

The second term ΔE of the right side of Eq. (1) is the amount corresponding to the deviation and contained in the position detection value using the rear surface position detectors 6a and 6b. The amount of the deviation varies according to variation in the tilt angle θ of the wafer. That is, the amount varies as indicated by the relationship $$\Delta E = -\epsilon = -d \cdot \sin\theta$$

Consequently, error ε arising from tilt of the wafer is canceled out at all times irrespective of the tilt angle of the wafer. As a result, the correct position on the wafer surface corresponding to the mark position can be found precisely by detecting the mark position formed on the rear surface of the wafer.

On example of structure of a position detector producing a detected value containing an amount corresponding to deviation ΔE that cancels out the position detection error ε arising from the aforementioned tilt of the wafer is shown in the lower portion of FIG. 3. The principle of the position detection is described. In FIG. 3, when two light beams 18a and 18b having a wavelength of λ illuminate the rear surface alignment marks 7 on the rear surface of the wafer, diffraction light is obtained. The phase of the diffraction light varies depending on the position δ of each rear surface alignment mark 7 and on the spacing h between the positions A and B hit by the illuminating light beams, taken in a direction perpendicular to the reference plane. Let L be the space between both illuminating light beams. Let d be the thickness of the wafer. At this time, from FIG. 3, the following relationship holds between the spacing h between the illuminated positions and the tilt angle θ of the wafer:

$$\theta = \tan^{-1}(h/L) \approx h/L \quad (2)$$

An amount φ(ε) corresponding to the phase difference that depends on the amount of deviation ε between the position δ of each rear surface alignment mark 7 and the correct position ω on the wafer surface due to tilt of the wafer is given by $$\phi(\epsilon) = 4\pi\epsilon/P \quad (3)$$

where P is the pitch between the rear surface alignment marks 7. Meanwhile, the amount corresponding to the phase difference φ (ΔE) and arising from the space h between the illuminated positions that is a function of the angle of tilt θ of the wafer is given by the following equation regarding the wavelength λ of the detection light and the space h between the illuminated positions, because of the geometrical relationship shown in FIG. 3:

$$\phi(\Delta E) = 4\pi h/\lambda \quad (4)$$

That is, if the pitch P between the rear surface alignment marks 7 and the space L between both detection beams are previously selected such that the amount φ (ε) corresponding to the phase difference and given by Eq. (3) and the amount φ (ΔE) corresponding to the phase and given by Eq. (4) become equal to each other, the phase deviation at an arbitrary tilt angle of the wafer can be canceled out. Accordingly, solving Eqs. (1)-(4) simultaneously for the space L between the detection beams which satisfies the above-described relationship gives rise to the solution:

$$L = \lambda \cdot d/P \quad (5)$$

For example, it is assumed that the pitch P between the marks is 6 μm, the thickness d of the wafer is 600 μm, and the wavelength λ of the detection beams is 633 nm. It can be seen that if the beam space L is set to 63.3 μm, satisfactory results are obtained. The beam space L is determined by the angle of divergence ξ of a Wollaston prism 20 and the focal length f of an objective 19. That is, where the required beam space L is known, the angle of divergence ξ is determined by the following equation.

$$\xi = 1/(2f) \quad (6)$$

That is, a Wollaston prism having such an angle of divergence ξ should be used.

The phase difference φ between the light beams illuminating the two points A and B is detected to find the position ω. This method of detection is described.

A laser light source 23 which produce two frequencies (ν1 and ν2) of linearly polarized output light that are slightly different in wavelength is used. The light beam 45 from the light source is split into two by a beam splitter 22. One light beam obtained by the splitting enters a polarizer 25, where heterodyne interference is produced. The resulting interference light is detected by a photodetector 26, whereby a reference signal Sr providing a reference is obtained. The other beam obtained by the splitting enters the Wollaston prism 20, where the beam is split into a P-polarized beam 18a with frequency ν1 and an S-polarized beam 18b with frequency ν2. The separated beams 18a and 18b are converted into parallel beams by the objective 19 and illuminate two points A and B, respectively, on the rear surface of the sample. The space between the points A and B illuminated with the beams is L. At this time, we take notice of only − first-order diffraction light 30a, 31a and + first-order diffraction light 30b, 31b produced from the illuminated points A and B. The phase of the first-order diffraction light is varied by the position of each alignment mark 7 on the rear surface and by the tilt angle of the sample 1 as described previously. The amount of change φ of the phase can be found as the phase difference between the reference signal Sr from the photodetector 26 and the detection signal Sd from a detector 29 as shown in a lower part of the figure. The + first-order diffraction light 30a, 30b and − first-order diffraction light 30a, 31b are made parallel beams by the objective 19. The + first-order diffraction light (e.g., + first-order diffraction light 31b from the illuminated point B) from one illuminated point and the − first-order diffraction light (e.g., − first-order diffraction light 30a from the illuminated point A) from the other illuminated point are selected out by using a polarizing beam splitter 21 on the Fourier transform plane. The selected beams 31b and 30a are gathered by a collector lens 24. Heterodyne interference is produced by placing another Wollaston prism 27 at a point where both beams intersect. The resulting interference light is detected by the photodetector 29 via a polarizer 28. The obtained signals are the detection signal Sd and the reference signal Sr as shown in the left lower part of FIG. 3. The phase difference φ between them is given by $$\phi = 4\pi/P(\delta + \epsilon) \quad (7)$$

Thus, where the wafer tilts, the correct position on the wafer surface can be detected while detecting the position on the rear surface of the wafer by detecting the phase difference φ.

This makes it unnecessary to provide a tilt detector for detecting the angle of tilt of the wafer 1. A desired position at which a pattern is made on the surface of the wafer can be found accurately by detecting the positions of the marks on the rear surface of the wafer.

The method of forming the rear surface alignment marks 7 may be formation of steps using ordinary etching. A simple method making use of a laser beam writing system or laser marker may also be available.

Figure 5:
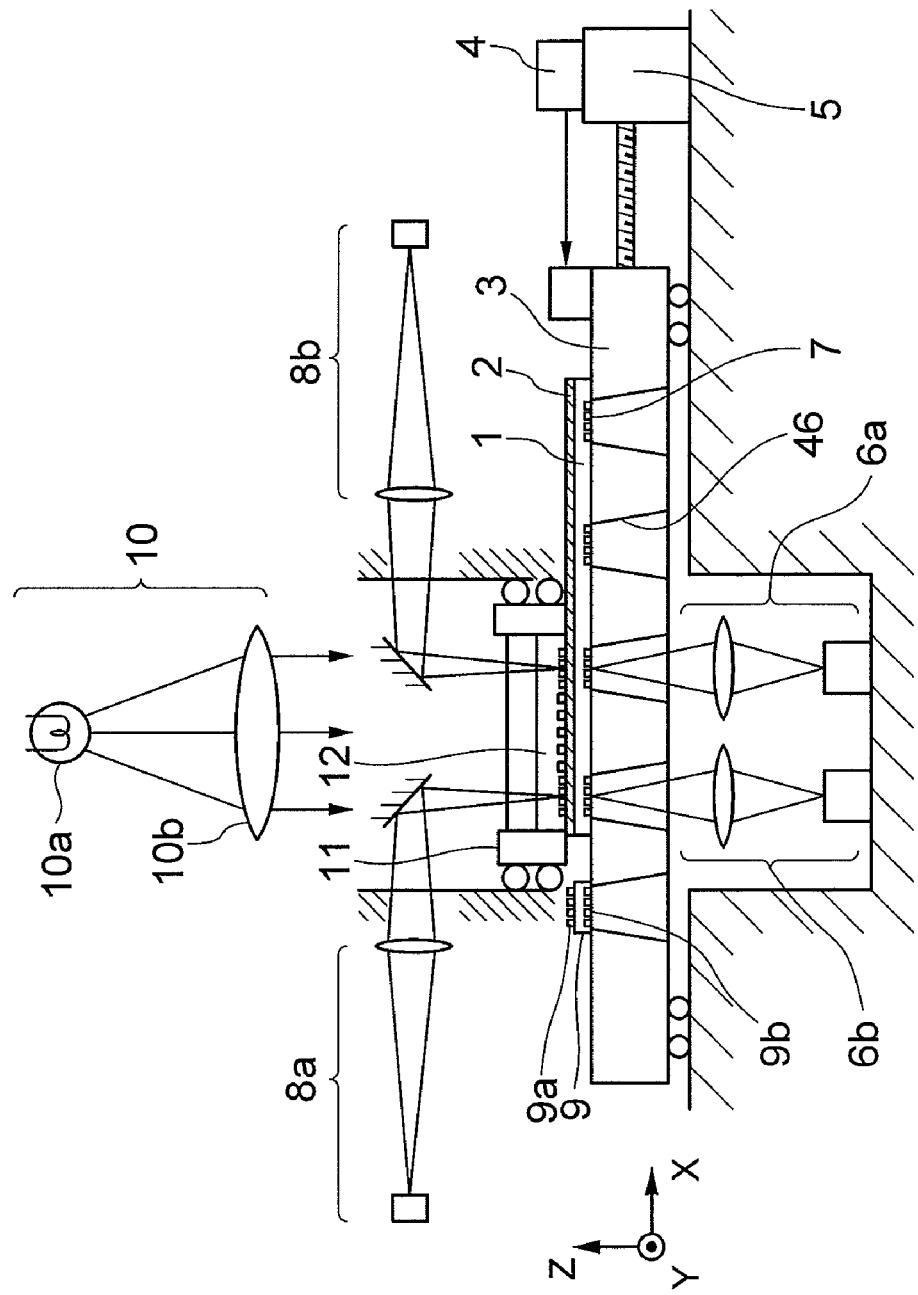
FIG. 5 is a diagram illustrating a method of forming a pattern in accordance with a yet other embodiment of the invention.
Figure 6:
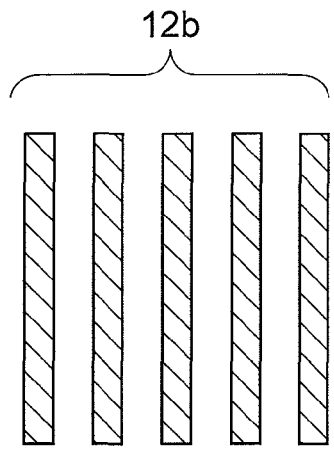
FIG. 6 is a view illustrating mold alignment marks in accordance with a still other embodiment of the invention.
Figure 7:
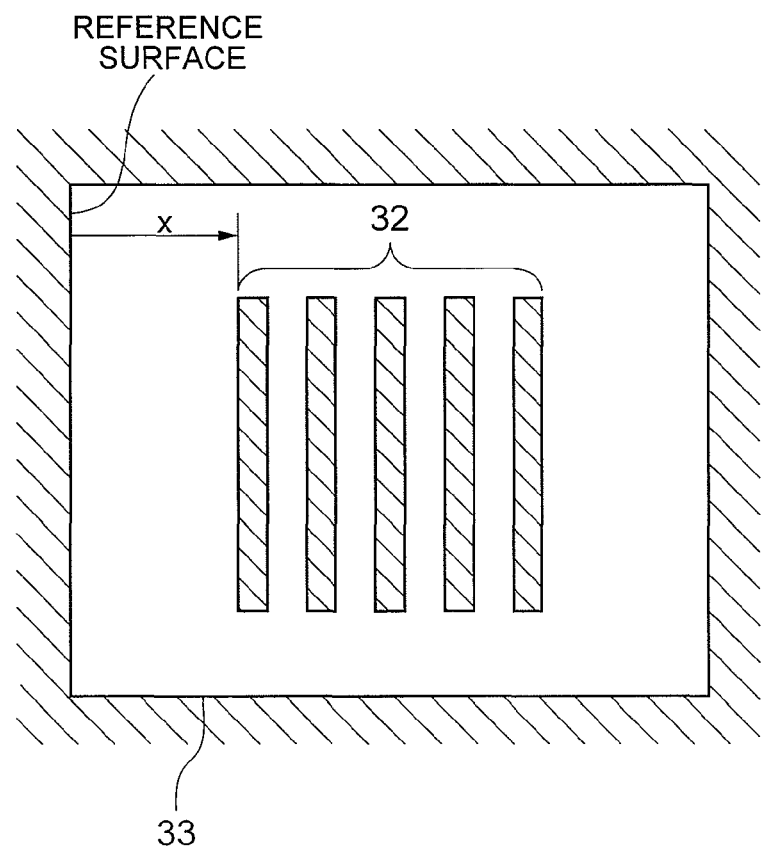
FIG. 7 is a diagram illustrating a method of detecting the positions of mold alignment marks in accordance with a yet further embodiment of the invention.
Figure 10:
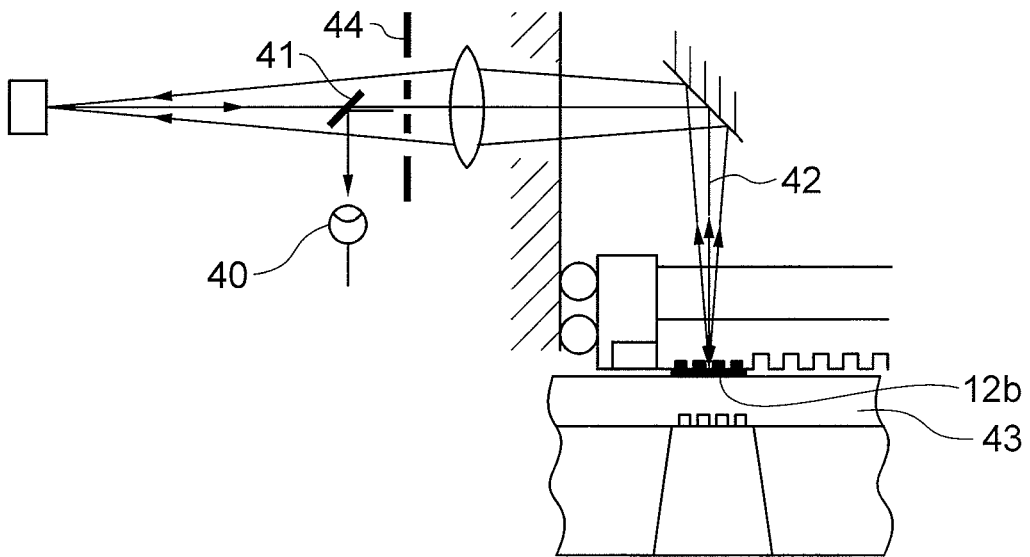
FIG. 10 is a diagram illustrating a method of calibrating a mold position detector in a heightwise direction in accordance with other additional embodiment of the invention.

The functions of the mold position detectors 8a and 8b are next described. As shown in FIG. 5, the mold position detectors 8a and 8b can detect the in-plane position of the mold when the mold stage 11 arrives at the vicinity of the pattern transfer position. An example in which a detection optical system for bringing the light to focus at this position is described by referring to FIG. 6. A mold alignment mark 12b is formed in a part of the surface on which a mold transfer pattern 12a is formed. A chromium film is deposited on the mold alignment mark 12b to enhance the optical contrast. A line-and-space pattern as shown in FIG. 6 is a preferable form. Light from a HeNe laser having a wavelength of 633 nm is used as the illumination light. As shown in FIG. 10, only the reflected light and the ± first-order diffraction light produced from the mold alignment mark 12b are selected by a spatial filter 44 and gathered. An optical image 32 of the mold alignment mark 12b is focused onto the image-receiving surface of an image sensor (see FIG. 7) equipped in the mold position detectors 8a and 8b. The image sensor has a reference surface 33. The absolute position of the mold alignment mark 12b can be detected by detecting the distance x from this surface to the optical image 32. For example, it is assumed that the lines of the mold alignment mark are 1 μm, the space between them is 1 μm (pitch is 2 μm), and the number of the lines is five. The system can be designed such that it can detect an absolute position at a resolution of several nanometers. In the present detection of the mold position, the pattern 12a to be transferred and the mold alignment marks 12b are present on the same plane and so the detection is not affected by the thickness of the mold 12, unlike detection of a rear position of the wafer.

Figure 9:
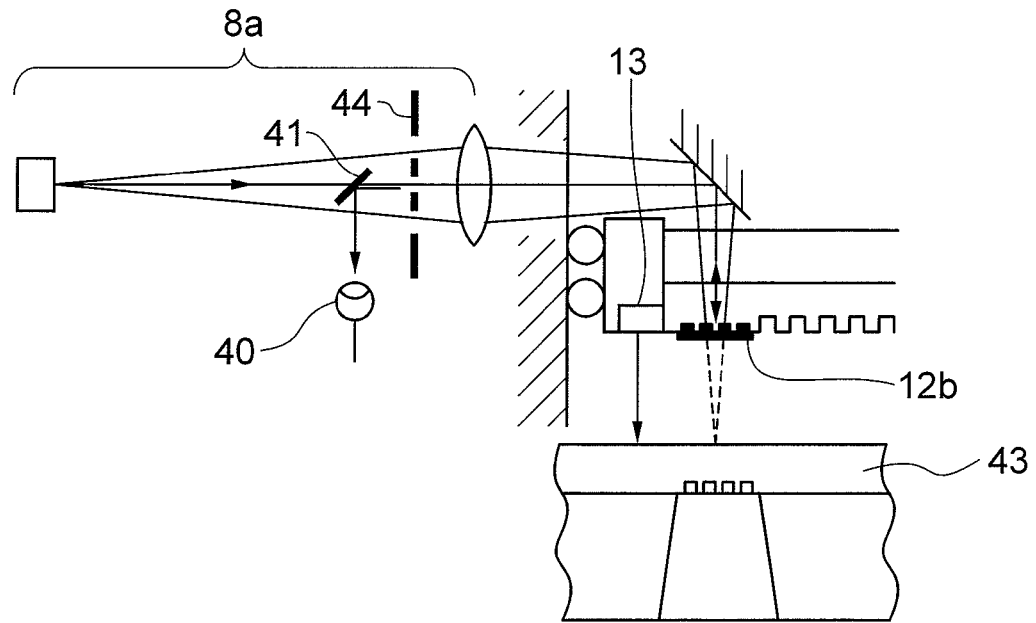
FIG. 9 is a view illustrating a mold position detector according to a yet additional embodiment of the invention.

A method of detecting a heightwise position of the mold is next described by referring to FIGS. 9 and 10. Light having a wavelength of 633 nm and emitted from a HeNe laser is used as the light for the position detection. The light is emitted as a parallel beam and made to fall on the mold alignment mark 12b, whereby illuminating it. Of the diffraction light from the mark, positively reflected zeroth-order diffraction light 42 is used. The zeroth-order diffraction light is selected by the spatial filter 44. The reflected zeroth-order diffraction light is made to interfere with the reference light by an interferometer 41. The heightwise position of the mold alignment mark 12b relative to the reference position of the position detector 8a is detected by a photodetector 40.

A reflective film is formed on the mold alignment mark 12b to prevent transmission of the position detection light, and eliminates the effects of reflected light from the underlying wafer plate and so on. Adoption of this configuration yields the advantage that two pieces of information indicating the in-plane position of the mold and the heightwise position are obtained with the single mold position detector 8a alone. The material of the reflective film can be the same chromium as that of the mark or other metal.

The present mold position detectors 8 are formed in at three positions on the mold. The tilt of the mold can be controlled according to information about the height of the mold at the three different positions. The mold can be moved up and down in a parallel relationship to the wafer plate. By performing this operation, the mold can be pressed against the wafer without being affected by the resin coated on the wafer plate. Therefore, variations in the pattern formed on the resin film due to nonuniform pressing operation can be reduced.

The functions of the chip 9 for calibration are next described, the chip being on the top surface of the stage 3. The present chip is provided to define relative positions between the rear surface position detectors 6a, 6b and the mold position detectors 8a, 8b. The present chip is substantially identical in thickness with the wafer 1. An alignment mark 9a for the mold is formed on the front surface. A rear surface alignment mark 9b is formed on the rear surface. The chip 9 for calibration is fixed to a given position on the stage 3 as shown in FIGS. 1, 4, and 5.

Figure 4:
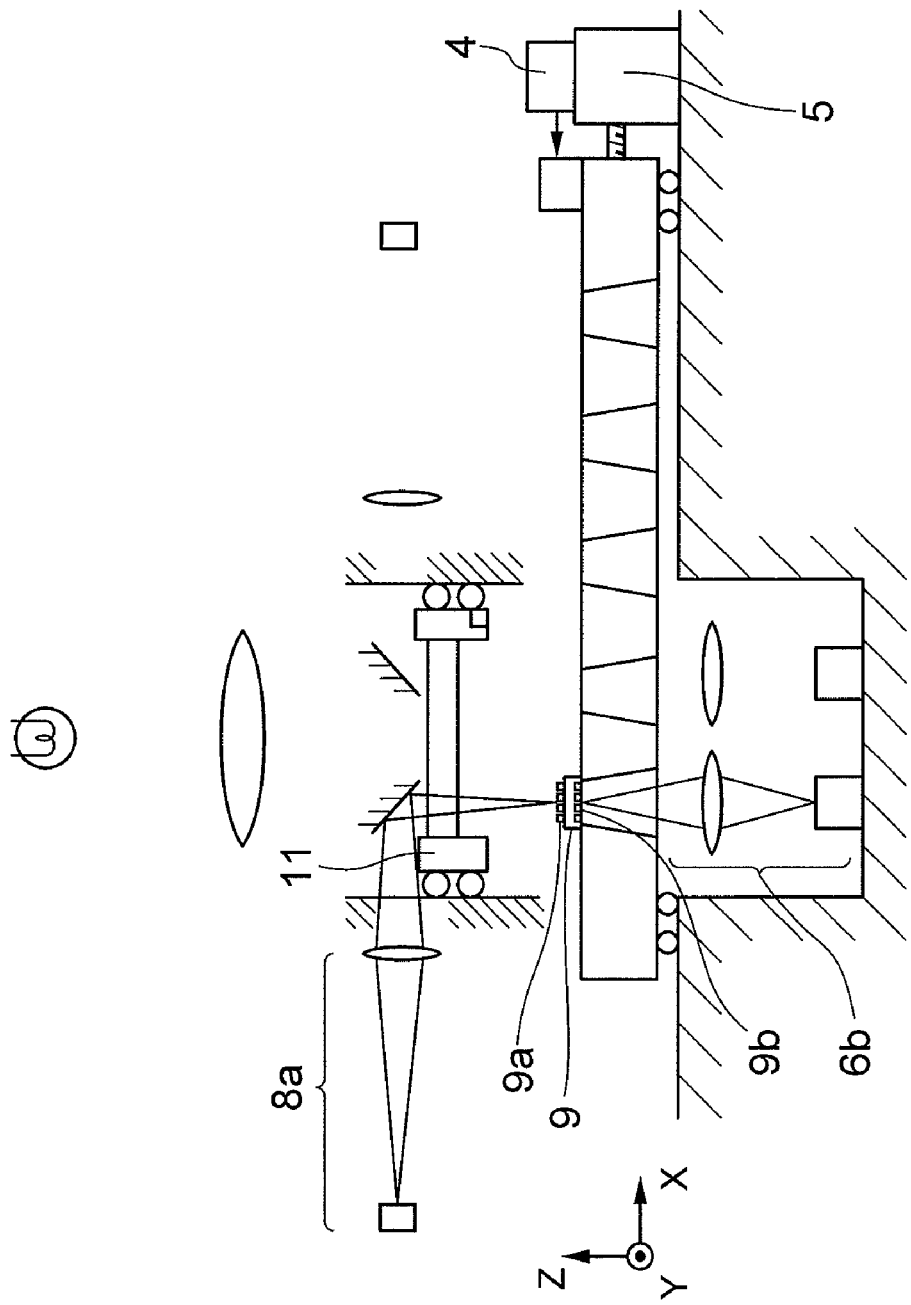
FIG. 4 is a diagram illustrating a method of calibrating alignment in accordance with a further embodiment of the invention.

A method of using the chip 9 for calibration is first described by referring to FIG. 4. Before loading the mold 12, the stage 3 is moved into an area where the positions of the rear surface position detectors 6a, 6b and mold position detectors 8a, 8b can be measured. Then, the stage is brought to a stop. Under this condition, with respect to the two marks 9a and 9b which are formed on the chip for calibration and spaced from each other in the up-and-down direction, their positions are measured as distances from the reference position, using the position detectors 6a and 8a, respectively. With respect to each measured value, calibration is performed, for example, such that the position C detected by the mold position detector 8a agrees with the position D detected by the rear surface position detector 6a. Thus, the mold position detector 8a and the rear surface position detector 6a are calibrated. FIG. 4 shows the manner in which the position detector on the left side of the system is calibrated. Also, with respect to the other position detector, after this calibration, the stage may be aligned with the region of the right position detector, and calibration may be performed by a similar method.

A method of calibrating values detected by the mold position detector 8a which indicate heightwise positions is next described. A dummy plate 43 having the same thickness as that of the wafer plate is loaded on the pattern forming system. The position of the mold in the heightwise direction is detected using the heightwise position detector 13 while lowering the mold. When the mold comes into contact with the dummy plate, the value of the mold position detector 8a in the heightwise direction is detected, and this position is stored as a contact position. Thus, calibration can be performed. When printing or transfer is effected in practice, resin is coated on the wafer plate and so the heightwise position detector 13 cannot detect the correct position, thus presenting a problem. According to the present embodiment, the precise height position can be detected without being affected by the resin with desirable results.

The method of forming patterns of semiconductor devices using nanoimprinting described so far and the procedure for forming the patterns using various functions of a lithography system for implementing the method are described in further detail.

First, the power supply of the pattern forming system using nanoimprinting is turned on to set the system into operation. As shown in FIG. 4, before the mold 12 is loaded, the position detectors, i.e., mold position detectors 8a, 8b, rear surface position detectors 6a, 6b, are calibrated. The method of calibration has been already described.

Then, as shown in FIG. 1, the mold 12 and the wafer 1 having the interconnection pattern 14 on which the interconnection film 15 and a photo-hardening resin (photocurable resin) have been coated to given film thicknesses are loaded. The rear surface alignment marks 7 for position detection have been previously formed on the rear surface of the wafer 1. As described previously, the marks preferably assume a line-and-space pattern having a given form as described previously. The rear surface alignment marks 7 are formed at given intervals. The marks are placed in alignment with the position of an opening 46 formed in a wafer chuck of the stage.

After moving the wafer stage 3 into a given position, the mold 12 is made to approach the wafer 1 from above it. Using the function of the mold position detectors 8 of detecting heightwise positions, the mold 12 is once poised immediately before contacting the photo-hardening resin film 2 formed on the top surface of the wafer (e.g., about 10 μm above the resin film). Under this condition, the relative position between the mold 12 and the wafer 1 is aligned into a given relationship, using the mold position detectors 8a, 8b and rear surface position detectors 6a, 6b. The mold 12 is pressed against the wafer 1 while holding this relative position and maintaining a given pressing force by making use of the output from a load sensor (not shown).

Then, the shutter of the mercury lamp 10 at the top portion is opened. The pattern is exposed optically through the mold 12 with a given optical dose. Then, the mold 12 is lifted to strip the resin pattern 16.

Figure 8:
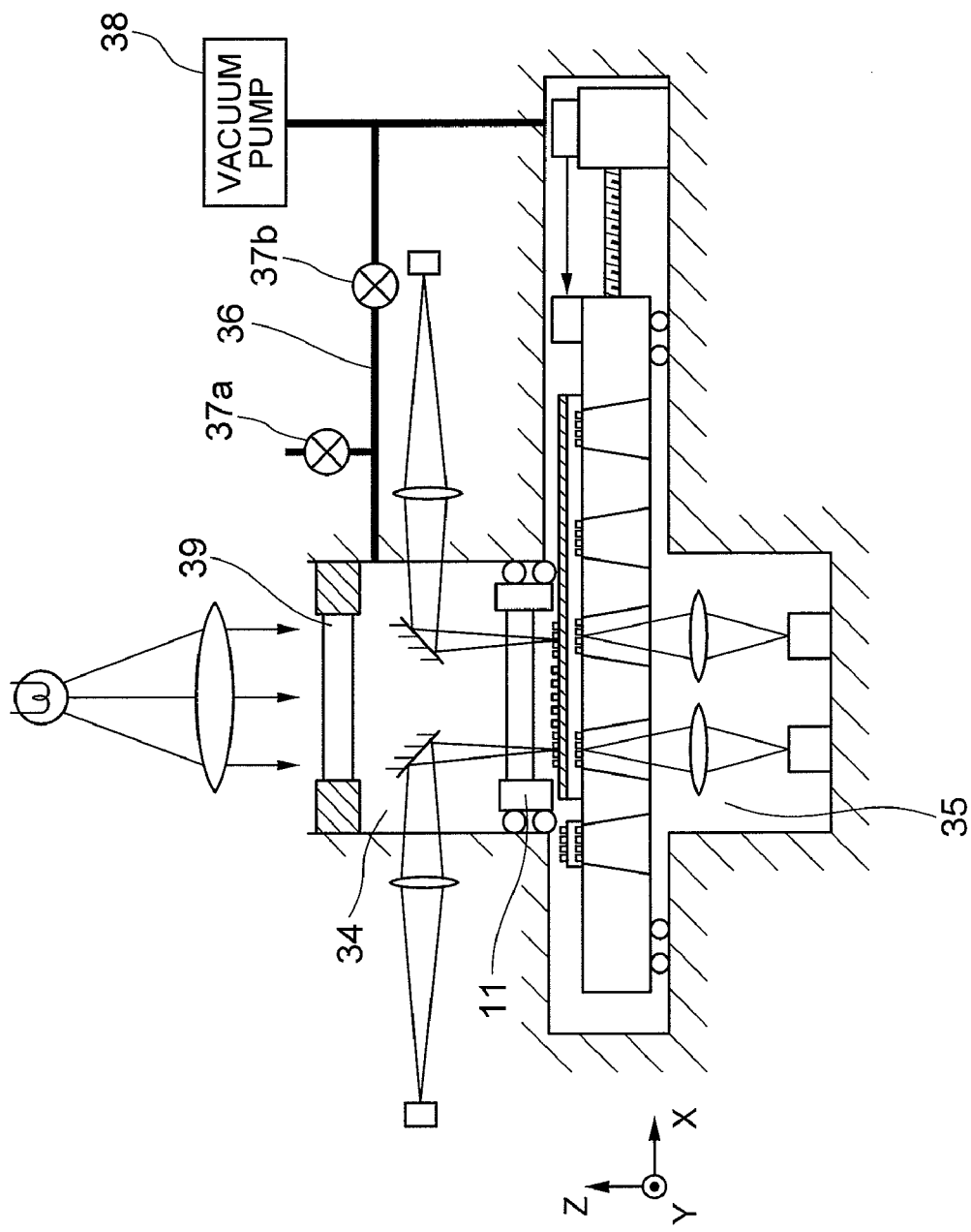
FIG. 8 is a diagram illustrating a method of applying a pressure by making use of a difference of pressure in accordance with an additional embodiment of the invention.

Regarding the method of applying pressure, the following method different from the method of mounting the above-described plural Z sensors can also be used. As shown in FIG. 8, a mold upper part chamber 34, which is partitioned into the mold stage 11 and a view port 39 made of glass that transmits UV light, and a stage chamber 35 are mounted. The stage chamber 35 is an area disposed in a portion located under the mold stage 11. The system equipped with a vacuum line 36 connected with a vacuum pump 38 is used in these areas. Thus, application of pressure utilizing a difference of pressure is accomplished. In particular, a valve 37a is first closed. When a valve 37b is open, the mold upper part chamber 34 and stage chamber 35 are evacuated. Then, an alignment is performed, and the mold stage 11 is lowered. Then, the valve 37b is closed. The valve 37a is opened. Consequently, a difference of pressure is produced between the upper chamber 34 in the upper part of the mold and the stage chamber 35. Atmospheric pressure is applied to the front surface of the upper part of the mold. Pressure is uniformly applied to the front surface of the upper part of the mold by performing these operations. Nonuniformity of the thickness of the transferred resin which would otherwise be caused by flexure of the mold is eliminated. In this example, atmospheric pressure is applied. Instead, gas of higher pressure may be introduced.

Where the mold 12 is smaller than the wafer 1, the stage 3 is stepped to the next position to bring the mold 12 close to the wafer 1 from above it. Using the Z sensors 13, the mold 12 is once poised immediately before the mold touches the photo-hardening resin film 2 formed on the top surface of the wafer, e.g., about 10 μm above the film. Under this condition, the relative position between the mold 12 and wafer 1 is aligned into a given relationship, using the mold position detectors 8a, 8b and the rear surface position detectors 6a, 6b. The mold 12 is pressed against the wafer 1 while holding this relative position and maintaining a given pressing force by making use of the output from the load sensor (not shown). These operations are repeated until the pattern is transferred to the whole surface of the wafer 1.

Then, using the resin pattern 16 as a mask, the underlying interconnection pattern is etched. Consequently, an interconnection pattern 17 is formed.

As described above, alignment errors that becomes problems when nanoimprinting is applied to lithography that is one of semiconductor device fabrication process steps are chiefly caused (i) by position detection errors due to nonuniform distribution of refractive indices through the resin produced by contact between the resin film formed on the surface of the wafer 1 and the mold and (ii) by nonuniform positional deviations due to in-plane forces produced as the resin is pressed and spreads out within the plane. The aforementioned alignment error issues can be solved by performing a relative alignment using the wafer rear surface alignment and the mold alignment system as described in the present embodiment and makes a pattern while pressing both against each other while maintaining the relative position.

Furthermore, where the mold 12 is optically transparent, it is obvious that equipping the mold position detectors 8 with a plate tilt effect canceling function similar to the function of the rear surface position detectors 6 will produce good results; the details would not need to be described herein.

Devices fabricated using a pattern formation system of the present embodiment can be applied to other than semiconductor devices. For example, three-dimensional photonic crystals that are recently under intensive discussion can have characteristics capable of controlling light emission characteristics by incorporating artificial structures into the periodic structures to disturb the periodic structures (Proceedings of the Japan Society of Applied Physics, Vol. 74, February, pp. 147-159). The pattern formation system can be used as a technique for fabricating such 3D structures. In addition, devices can be fabricated at much lower costs than where the prior-art lithography technology is used. Consequently, it can be said that the invention yields great advantages when applied to the industry.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A pattern forming method for forming a pattern by pressing a mold with nanostructures on its surface against a plate coated with a resin film by the use of nanoimprinting, said method comprising the steps of:

performing a relative alignment between the mold and the plate coated with the resin film by detecting positions of alignment marks formed on a rear surface of the plate coated with the resin film;

measuring a distance between the mold and the plate coated with the resin film;

stopping the mold immediately before it comes into contact with the plate coated with the resin film;

aligning a relative position between the mold and the plate coated with the resin film within a plane in which the nanostructures will be formed; and pressing the mold against the plate coated with the resin film while maintaining the relative position.

2. A pattern forming method as set forth in claim 1, wherein said step of measuring a distance between the mold and the plate coated with the resin film is carried out by illuminating the alignment marks that assume a line-and-space pattern formed on the mold with a beam arising from a light source made of a laser with a given periodic pitch and determining the distance of the mold to the plate coated with the resin film using zeroth-order diffraction light out of diffraction light reflected from the alignment marks.

3. A pattern forming method for forming a pattern by pressing a mold with nanostructures on its surface against a plate coated with a resin film by the use of nanoimprinting, said method comprising the steps of:

performing a relative alignment between the mold and the plate coated with the resin film by detecting positions of alignment marks formed on a rear surface of the plate coated with the resin film;

measuring a distance between the mold and the plate coated with the resin film at plural positions;

stopping the mold immediately before it comes into contact with the plate coated with the resin film;

aligning the relative position between the mold and the plate coated with the resin film within a plane in which the nanostructures will be formed into a given relationship; and pressing the mold against the plate coated with the resin film while maintaining the relative position and securing parallelism between the mold and the plate based on the distance between the mold and the plate measured at the plural positions.

4. A pattern forming method as set forth in claim 1, wherein the mold is pressed against the plate according to a difference of pressure produced between above and below the mold.

5. A pattern forming method for forming a pattern by pressing a mold with nanostructures on its surface against a plate coated with a resin film by the use of nanoimprinting, said method comprising the steps of:

performing a relative alignment between the mold and the plate coated with the resin film by detecting positions of alignment marks formed on a rear surface of the plate coated with the resin film;

wherein positions on a front surface of the plate which correspond to positions on a rear surface of the plate are detected by finding a phase difference ($\phi$) between beams of light illuminating at least two points of the alignment marks formed on the rear surface of the plate.

6. A pattern forming system for forming a pattern by pressing a mold with nanostructures on its surface against a plate coated which a resin film by the use of nanoimprinting, said pattern forming system comprising:

means for pressing the mold against the plate coated with the resin film; and means for performing a relative alignment between the mold and the plate coated with the resin film within a plane in which the nanostructures will be formed by detecting positions of alignment marks formed on a rear surface of the plate coated with the resin film;

means for measuring a distance between the mold and the plate coated with the resin film; and means for applying a load while maintaining the position of the mold relative to the plate coated with the resin film within the plane in which the nanostructures will be formed.

7. A pattern forming system as set forth in claim 6, wherein the means for measuring a distance between the mold and the plate coated with the resin film are provided in plural locations, and wherein there is further provided means for applying a load while maintaining the mold and the plate coated with the resin film in a parallel relationship and maintaining the position of the mold relative to the plate coated with the resin film within the plane in which the nanostructures will be formed.

8. A pattern forming system as set forth in claim 6, wherein the means for pressing the mold against the plate coated with the resin film applies pressure by making use of a difference of pressure produced between above and below the mold.

9. A pattern forming system for forming a pattern by pressing a mold with nanostructures on its surface against a plate coated which a resin film, said pattern forming system comprising:

a plate stage for holding the plate coated with the resin film;

stage-driving means capable of moving the plate stage into a given position;

a mold stage for holding the mold;

rear surface position detectors for detecting positions of alignment marks formed on a rear surface of the plate coated with the resin film;

a mold position detector for detecting a position of a plane in which the nanostructures will be formed on the mold; and means for performing a relative alignment between the plate and the mold based on results of the detections performed by the rear surface detectors and mold position detector.

10. A pattern forming system as set forth in claim 9, wherein the mold position detector has a function of detecting a position of the mold in a heightwise direction.

11. A pattern forming system as set forth in claim 9, wherein (A) the mold has alignment marks for alignment,
(B) the alignment marks can be detected optically through the mold, and
(C) reflected light from the alignment marks is reflected substantially from the alignment marks and does not transmit through the alignment marks.

12. A pattern forming system as set forth in claim 11, wherein the alignment marks formed on the mold assume a line-and-space pattern.

13. A pattern forming system as set forth in claim 11, wherein a reflective film is formed on the alignment marks that are formed on the mold.

14. A pattern forming system as set forth in claim 9, wherein said mold position detector has (a) means for illuminating the mold with light for position detection,
(b) a spatial filter for selecting only ± first-order diffraction light out of diffraction light reflected from the alignment marks formed on the mold in response to the light illuminating the mold, the light being for position detection,
(c) a spatial filter for selecting only zeroth-order diffraction light, and (d) an optical element for guiding the +first-order diffraction light and the zeroth-order diffraction light to different means of photodetector.

15. A pattern forming system as set forth in claim 9, wherein there is further provided a chip for calibration, the chip being used to constitute a reference position for the rear surface position detectors and for the mold position detector.

16. A pattern forming system as set forth in claim 9, further comprising:
   a mold upper part chamber and a stage chamber disposed respectively above and below the mold; and
   means for pressing the mold against the plate by making use of a difference of pressure produced between the upper and lower chambers.

17. A pattern forming system as set forth in claim 9, further comprising:
   means for measuring a gap between the mold and the plate at plural locations;
   gap position control means: and
   load control means.

* * * * *